United States Patent [19]
Zhou et al.

[11] Patent Number: 5,465,418
[45] Date of Patent: Nov. 7, 1995

[54] SELF-OSCILLATING MIXER CIRCUITS AND METHODS THEREFOR

[75] Inventors: Xuesong Zhou, Philadelphia, Pa.; Afshin S. Daryoush, Shaker Heights, Ohio

[73] Assignee: Drexel University, Philadelphia, Pa.

[21] Appl. No.: 180,650

[22] Filed: Jan. 13, 1994

Related U.S. Application Data

[63] Continuation-in-part of Ser. No. 54,717, Apr. 29, 1993.
[51] Int. Cl.$^6$ .................................................. H04B 1/28
[52] U.S. Cl. ........................ 455/332; 455/323; 455/333
[58] Field of Search ................................ 455/323, 332, 455/333, 76, 260, 319, 318, 321; 331/42, 51, 108 A, 108 B, 114, 58, 59; 343/824; 330/262, 263, 264, 265, 269, 271

[56] References Cited

U.S. PATENT DOCUMENTS

| | | | |
|---|---|---|---|
| 2,554,107 | 5/1951 | Kleis et al. | 455/332 |
| 3,462,690 | 8/1969 | Pelka | 455/333 |
| 4,112,373 | 9/1978 | Miyamoto et al. | 455/333 |
| 4,160,953 | 7/1979 | Matsuura et al. | |
| 4,219,779 | 8/1980 | Shinkawa et al. | |
| 4,264,980 | 4/1981 | Hasler | |
| 4,334,324 | 6/1982 | Hoover | 455/332 |
| 4,542,531 | 9/1985 | Fukumura | 455/76 |
| 4,593,411 | 6/1986 | Schiller | |
| 4,658,440 | 4/1987 | Pavio et al. | |
| 4,688,005 | 8/1987 | Kipnis | |
| 5,003,620 | 3/1991 | Tenjin | |
| 5,175,885 | 12/1992 | Lange et al. | |

FOREIGN PATENT DOCUMENTS

| | | |
|---|---|---|
| 2808417 | 8/1979 | Germany. |
| 3813865 | 12/1988 | Germany. |
| 2225236 | 4/1992 | Japan. |

*Primary Examiner*—Edward F. Urban
*Assistant Examiner*—Nguyen Vo
*Attorney, Agent, or Firm*—Plevy & Associates

[57] ABSTRACT

Self-oscillating mixer circuits for use in communications systems. The circuits comprise a push-pull amplifier for amplifying a signal having a first frequency to produce an amplified signal, a feedback loop coupled to the push-pull amplifier for phase shifting the amplified signal during each half cycle of the push-pull amplifier, thereby creating an oscillating output signal, and a mixing element for coupling the oscillating output signal to the signal having the first frequency, thereby mixing the signal having the first frequency with the oscillating signal to produce a signal having a second frequency. The circuits described herein have transistors that operate near the class B mode to obtain optimal frequency conversion with minimal power consumption. These circuits will therefore find use in any communications-type system which requires a frequency converter.

7 Claims, 10 Drawing Sheets

SELF-OSCILLATING MIXER CIRCUITS AND METHODS THEREFOR

RELATED APPLICATIONS

This application is a continuation-in-part of U.S. Pat. application Ser. No. 08/054,717, entitled Push-Pull Self-Oscillating Mixers, filed Apr. 29, 1993, the teachings of which are specifically incorporated herein by reference.

FIELD OF THE INVENTION

The present invention relates generally to communications circuits for transforming a signal having a first frequency to a signal having a second frequency. More specifically, the present invention relates to self-oscillating mixer circuits for converting a signal having a first frequency to signal having a second frequency, and methods therefor.

BACKGROUND OF THE INVENTION

In modern communications systems, frequency conversion is typically performed by combining in a non-linear device called a mixer circuit a radio frequency/intermediate frequency ("RF/IF") signal with a stabilized carrier that is produced by a local oscillator ("LO") circuit. The transistors used in oscillators are typically biased at class A for higher output power, while transistors used in mixers are biased in proximity to class B for optimum frequency conversion gain. Along with higher power consumption, class A oscillators also have small subharmonic injection locking ranges and higher AM to FM conversion, both of which cause increased phase (FM) noise degradation in the transceiver.

Previously, it was believed not to be possible to combine class A oscillators with class B mixers in one device or device pair while maintaining a high conversion efficiency. In attempting to combine these two functions, the non-linearity of the device in the oscillator circuit was typically exploited to obtain frequency conversions in the so-called "self-oscillating" mixer. Unfortunately, such attempts have failed to achieve high conversion efficiency because while the operating point is appropriate for oscillators, it is not optimum for mixers.

The locking band and phase noise degradation in a subharmonically locked oscillator are controlled by the non-linearity of the device, the device noise power and the circuit topology of the oscillator. The most important variable in a mixer, the conversion gain/loss, is also dependent upon device non-linearity, as well as the circuit topology of the mixer. Thus, the non-linearity of the device depends on the parameters of the device itself and its operating point.

Because circuit designers have been unsuccessful in combining mixers and oscillators in one device or device pair, modern frequency convertor circuits are relatively large and, as a whole, can include five or more transistors along with passive component circuitry. Similarly, the operating point for a field effect transistor ("FET") oscillator is frequently at class A, but for a FET mixer, it is at class B. Operating close to class B, the non-linearity of the FET device can be enhanced. A large non-linearity increases the subharmonic injection locking range of the oscillator, thus minimizing the phase noise degradation, and enhancing the conversion gain of the mixer. This design approach is, therefore, based on achieving stable class B operation for both the mixer and oscillator.

The necessity of large-volume monolithic microwave integrated circuits ("MMICs") for mobile communications and satellite communications has increased considerably since about 1985. Specialized subsystem circuit topologies in transmitter/receiver (T/R) arrays compatible with the MMIC fabrication must be envisioned to realize efficient large phased array antennas at millimeter wavelengths. The most useful topology is one which employs a minimal number of devices, occupies a minimum space, is small, and consumes low power, while providing high conversion efficiency.

Because information is converted up to millimeter wavelengths for transmission and down-converted to base band in the reception, LO and mixer combinations are quite frequently used for achieving this frequency translations. These oscillators and mixers are realized by use of transistors which are conventionally operated at different operating ("Q") points.

There are a number of prior art patents directed to self-oscillating mixers and mixer circuits. German Patent No. 3,813,865 discloses a self-sustaining converter with push pull mixer. The device disclosed in the German patent is intended for use with identically conductive transistors and is limited since it has an operation frequency of only up to 500 megahertz UHF, a low RF and low IF isolation point and low frequency conversion gain. Furthermore, this circuit requires a balun for asymmetric to symmetric input to output transformation and is limited to the common base configuration.

Several U.S. patents are directed to mixer circuits. For example, U.S. Pat. No. 4,593,411, Schiller discloses a diode mixer arrangement including a mixer stage connected for receiving a signal having a frequency to be converted, and an oscillator signal having one of a plurality of preselectable oscillator frequencies. The teachings of the Schiller patent are specifically incorporated herein by reference.

A similar device is taught in U.S. Pat. No. 5,175,885, Halloran et al., which discloses an improved wideband double balanced GaAs mixer including a plurality of FETs which are operative to couple a plurality of input signals to a diode ring guad in which the signals are mixed, producing output IF signals comprising multiples of the sum and difference frequency of the alternating input signals. Additionally, U.S. Pat. No. 5,003,620, Tenjin, discloses plural circuits for generating intermediate frequency signals such as UHF, VHF, and HYPER intermediate frequency signals provided in parallel. Each of the circuits includes an intermediate frequency amplifier whose output impedance varies between high and low impedances. The teachings of both the Halloran, et al. and Tenjin patents are also specifically incorporated herein by reference.

None of the aforementioned prior oscillator or mixer circuits combines the functions of oscillators and mixers in a single circuit. Thus, prior devices have been simply unable to provide both these functions in a cost-effective and efficient manner since these two functions have heretofore been implemented in separate circuits which operate at different Q points. This requires separate circuit topologies when frequency conversion is required, thereby drastically increasing hardware costs in communications systems. The art has not to date devised a solution to these problems.

SUMMARY OF THE INVENTION

The aforementioned problems are solved and long-felt needs met with methods and circuits provided in accordance with the present invention for transforming a signal having a first frequency to a signal having a second frequency. In preferred embodiments, the circuits comprise push-pull amplifier means for amplifying the signal having the first frequency to produce an amplified signal, feedback means coupled to the push-pull amplifier means for phase shifting the amplified signal during each half cycle of the push-pull amplifier means, thereby creating an oscillating output signal, and means coupled to said push-pull amplifier means for coupling said oscillating output signal to said signal having the first frequency, thereby mixing the signal having the first frequency with the oscillating signal to produce the signal of the second frequency.

In a more preferred aspect of the communications circuits of the present invention, the push-pull amplifier means comprises a pair of field effect transistors. Even more preferably, the push-pull amplifier means comprises a pair of complimentary bipolar transistors.

In yet a further preferred embodiment, the feedback means comprises at least one transmission line connected between a drain and a gate of one of the field effect transistors such that a substantially one hundred and eighty degree phase shift is introduced to the amplified signal. In still another aspect of the communications circuits of the present invention, means interfaced with the pair of field effect transistors are provided for locking the frequency of the oscillating signal to prevent the oscillating signal from being free-running.

The circuits and methods described herein provide high performance frequency converters which preferably utilize a push-pull circuit topology. These circuits allow both mixing and oscillating functions to be performed and achieve high frequency conversion gains and large locking ranges in a class B power-efficient operating mode. The number of active and passive components required in the circuits are significantly reduced, thereby reducing system size and power consumption, and increasing circuit reliability.

The use of a push-pull configuration where each transistor operates in a half cycle of oscillating frequency further provides a resultant reduction in power consumption. In addition, because the oscillators are optimally stabilized in class B mode at substantially higher non-linearity than a class A oscillator, the subharmonic injection locking range is also much larger, thereby resulting in significantly lower FM noise. Due to reduction in noise, higher conversion gain and higher dynamic range are achieved, along with very high LO-RF and LO-IF isolation. Such results have not heretofore been achieved in the art.

Due to these and other advantages, the circuits and methods provided in accordance with the present invention will find many uses in a myriad of applications. These include, among others, mobile and wireless telephones, television and radio systems, nearly all types of satellite communications systems, phased array antenna systems, personal communication networks, local area networks, fiber optic networks, and wireless in-building systems.

The invention will be best understood by those with skill in the art by reading the following detailed description of preferred embodiments of the invention in conjunction with the drawings which are first described briefly below.

BRIEF DESCRIPTION OF THE DRAWINGS

FIGS. 10A and 10B are block diagrams of optically controlled phased array antenna systems which utilize self-oscillating mixers provided in accordance with the present invention wherein FIG. 10A illustrates the transmit mode and FIG. 10B illustrated the receive mode.

DETAILED DESCRIPTION OF PREFERRED EMBODIMENTS

Figure 1:
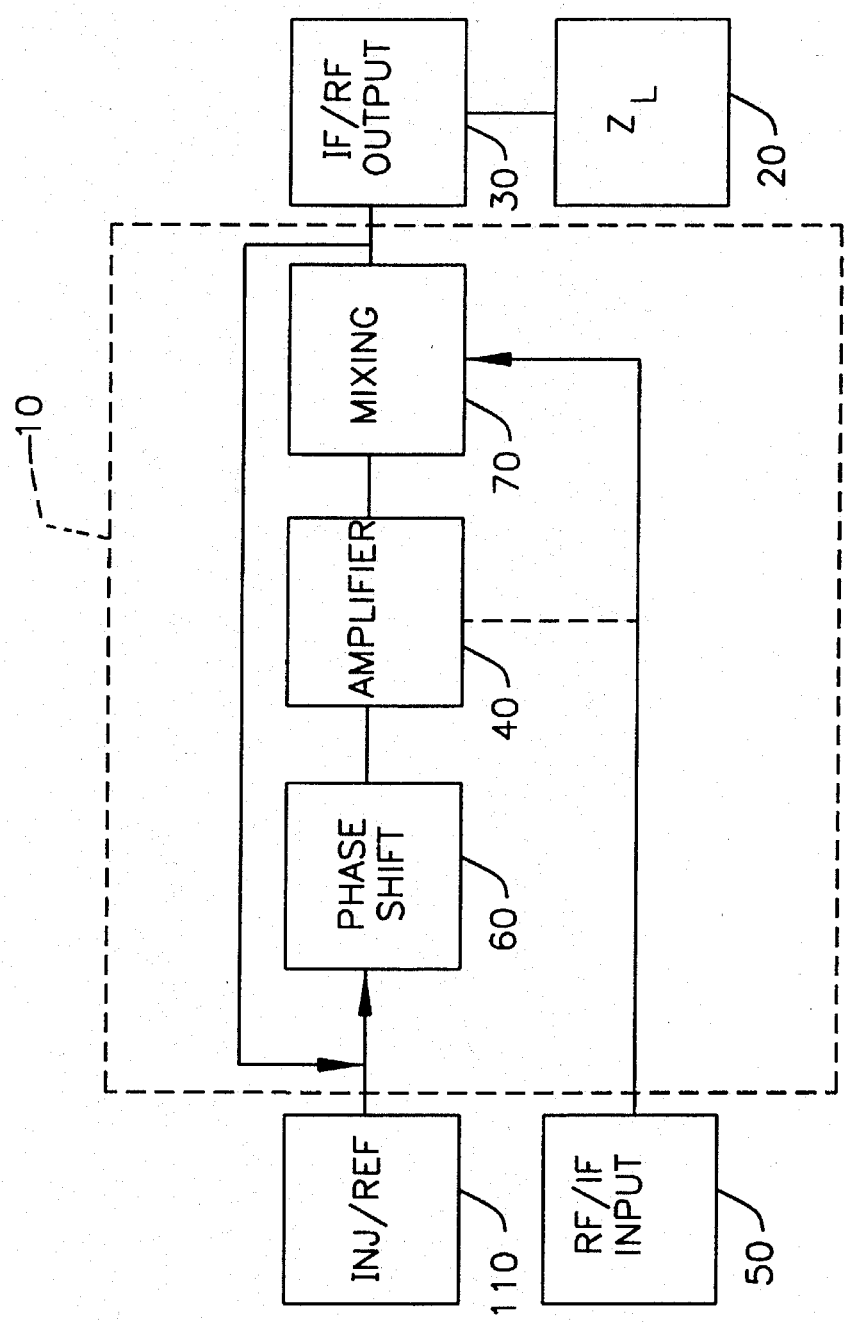
FIG. 1 is a block diagram of a self-oscillating mixer circuit interfaced with a load which will utilize a frequency converted signal produced by the circuit.

Referring now to the drawings wherein like reference numerals refer to like elements, FIG. 1 is a block diagram of a preferred embodiment of a circuit shown at 10 provided in accordance with the present invention. The circuit is interfaced to a load 20 which receives a signal from an IF/RF output block 30 interfaced to the circuit 10.

Preferably, circuit 10 comprises an amplification block 40 which is adapted to amplify a signal input to the block 40 from an RF/IF input block shown generally at 50. The circuit also comprises a phase shift block 60 and mixing block 70 which introduce the relatively linear oscillating function and the non-linear mixing function to the system. The RF/IF input block 50 inputs a signal having a first frequency so that the signal having the first frequency is amplified by block 40 to produce an amplified signal.

More preferably, the signal having the first frequency is first interfaced to the mixing block 70. Phase shift block 60 receives an injection/reference signal from block 110 which can then be further mixed through block 70 with the input signal of the first frequency which has been amplified by block 40. This results in a mixed, oscillating signal having a frequency preferably different than the first frequency which is bussed to the output block 30 and which can then be further conditioned by the output block if necessary for particular applications. The signal having a second frequency is then applied to load 20. Still more preferably, the amplification block 40 and mixing block 70 operate in the well known "Class B" mode.

Figure 2A:
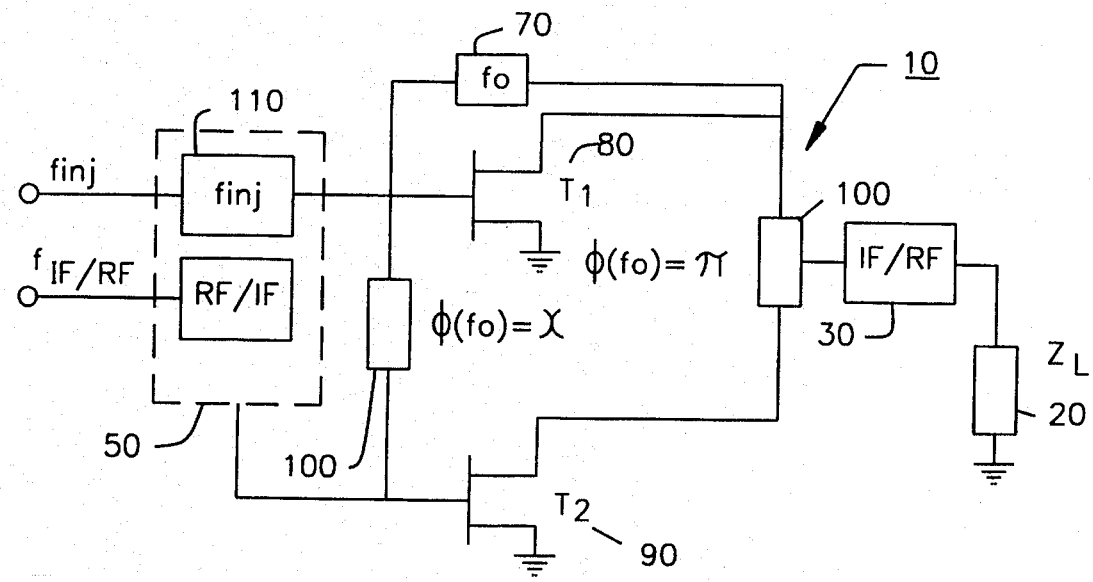
FIG. 2A is schematic of a self-oscillating mixer of the present invention which utilizes a push-pull amplifying topology comprising two FETs, and transmission lines to introduce a phase shift to the signals to produce local oscillations.

In a preferred embodiment, the self-oscillating mixer of FIG. 2A comprises two FETs, T1 shown at 80 and T2 shown at 90, which are configured in the well known "push-pull" amplifier circuit topology. As known by those with skill in the art, a push-pull amplifier circuit comprises two amplifiers which operate 180° out of phase with each other so that the net Q point of the circuit is located exactly at the cut-off point of each amplifier. Thus, each half of the AC signal input to the push-pull circuit is handled by one of the two separate amplifiers drawing AC power from each of them in turn.

With respect to the two amplifiers 80 and 90 of FIG. 2A, when a positive signal is applied to the gate of transistor 80, an equivalent negative signal is applied to the gate of transistor 90. Hence, transistor 80 amplifies the signal while transistor 90 is cut off. Correspondingly, when the signal is negative at the gate of transistor 80, and positive at the gate of transistor 90, transistor 90 amplifies and transistor 80 is cut off. The resulting output signal from the push-pull circuit is an amplified signal having the same shape as the input signal, but with amplified power because of the push-pull operation.

In accordance with the invention, the amplified output signal is caused to oscillate by transmission lines, shown generally at 100, which provide a 180° phase shift at a frequency $f_0$ in a feedback path between the gates and the drains of transistors 80 and 90. This feedback path through the transmission lines 100 creates the self-oscillation in the circuit at $f_o$ to obtain the desired LO frequency in accordance with the invention. The oscillating signal is then mixed with the input signal having the first frequency which results in an output signal having a second frequency appearing at output block 30. The output signal of the second frequency is applied to load 20 and can be used for any variety of applications to be discussed hereinafter.

Even more preferably, the input block 50 further comprises an injection block 110 which provides an injection signal, $f_{inj}$, that acts as a synchronizing signal to lock the oscillating signal's frequency to $f_{inj}$. This aids in reducing the frequency modulated (FM) noise of the free running oscillator. Furthermore, injection locking reduces noise in the mixer and achieves higher dynamic range for the circuit.

Figure 2B:
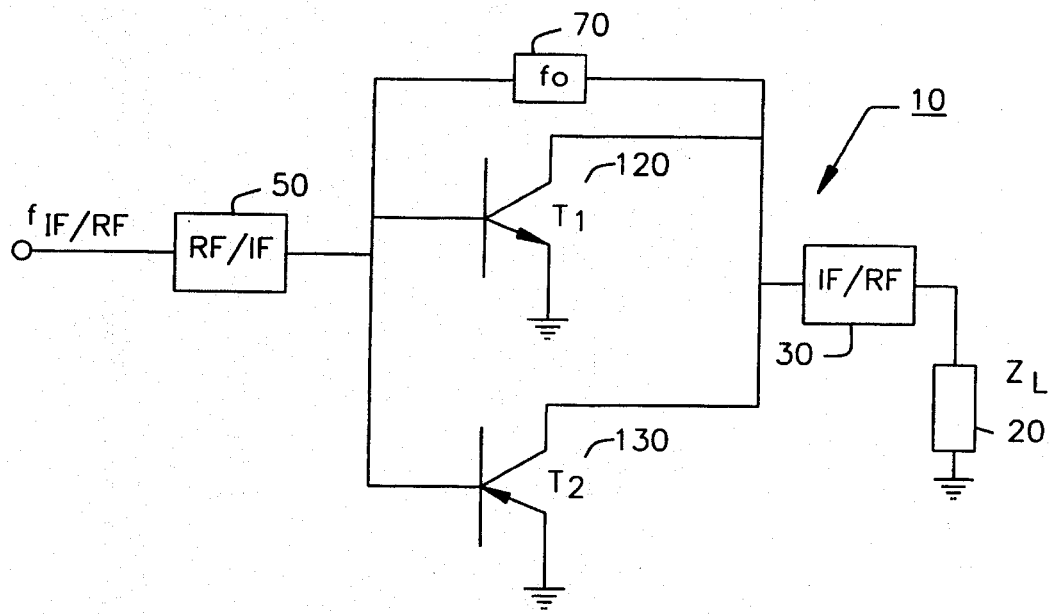
FIG. 2B is a schematic of a second embodiment of a self-oscillating mixer of the present invention comprising a complimentary symmetrical pair of bipolar transistors.

In yet a further preferred embodiment of self-oscillating mixers provided in accordance with the present invention, a complementary pair of bipolar transistors shown at 120 and 130 in FIG. 2B may be used instead of the standard push-pull topology discussed above. In the embodiment of FIG. 2B, bipolar transistor 120 is an npn transistor, while bipolar transistor 130 is a pnp transistor. As with the push-pull circuit of FIG. 2A, the complementary symmetrical circuit of FIG. 2B causes one of the transistors to amplify the input signal while the other is cut off, and vice-versa.

While a push-pull amplifier using FETs requires two identical transistors, the complementary symmetrical configuration of FIG. 2B only requires that the npn and pnp transistors have equivalent characteristics. Several types of complimentary bipolar transistors such as the 2N3904 (npn) and 2N3906 (pnp) transistors are available today which could be used in the circuit topology of FIG. 2B. Furthermore, the 2N4123 and 2N4125 matched pair of transistors are somewhat less expensive and therefore could also be used, but they have a lower current gain rating.

Restrictions on complimentary symmetrical circuits of the type shown in FIG. 2B exist since power supplies in such circuits usually float. However, as more sophisticated complementary pairs become available, use of the complimentary symmetrical configuration will become more preferred. The complementary pair eliminates the need to use the transmission lines 100 of FIG. 2A to achieve the LO frequency, $f_0$, since by the inherent 180° phase shift of the complimentary npn and pnp transistor pair achieve this result. This will have a significant advantage over standard junction FETs which are usually used in the known push-pull configurations.

Analytical modeling of the circuits provided in accordance with the present invention is based on the non-linear current-voltage ("I–V") relationship of the transistors. Preferably, a power series is used to relate the drain current to the gate voltage as follows:

$$I = a_1 V + a_2 V^2 + a_3 V^3 + \ldots, \tag{1}$$

where the "a" 's are unknown coefficients which can be determined from measurements. Based on the non-linear relationship of the power series of Equation (1), the subharmonic injection locking range and the mixer frequency can be calculated.

To determine the subharmonic injection locking range, the input voltage of the two transistors 80 and 90 can be written as:

$$V_1 = E_0 \cos\omega_{LO} t + E_{inj} \cos(\omega_{inj} t + \phi)$$

$$V_1 = -E_0 \cos\omega_{LO} t + E_{inj} \cos(\omega_{inj} t + \phi + \pi n) \tag{2}$$

where n, an integer number, is the subharmonic factor used in the subharmonic injection locking of the push-pull oscillators, that is:

$$\omega_{inj} \approx \frac{\omega_{LO}}{n}, \text{ and } \phi = \pm \frac{\pi}{2n}.$$

A feedback circuit satisfying the transfer function $H(\omega)$ is then employed to predict the subharmonic locking range using the well known harmonic balance method. The expected locking range is thus derived as:

$$\Delta\omega^{1/2} = \frac{\omega_0}{2Q} \frac{E_{inj}}{E_0} \frac{2a_2 E_{inj}}{4a_1 + 3a_3(E + E_0^2)_{inj}^2} \quad n=2 \tag{3}$$

$$\Delta\omega^{1/3} = \frac{\omega_0}{2Q} \frac{E_{inj}}{E_0} \frac{a_3 E_{inj}^2}{4a_1 + 3a_3(E_0^2 + E_{inj}^2)} \quad n=3$$

To determine the mixer conversion gain, the input voltage to the transistors 80 and 90 are written as:

$$V_1 = E_0 \cos\omega_0 t + E_{RF} \cos(\omega_{RF} t + \theta + \Delta\theta),$$

$$V_2 = -E_0 \cos\omega_0 t + E_{RF} \cos(\omega_{RF} t + \theta) \tag{4}$$

where $E_{RF}$ is the amplitude of the received RF signal to be down-converted by the local oscillator, and $\Delta\theta$ is the phase shift introduced by the transmission line, i.e., $$\Delta\theta = \frac{\omega_{RF}}{\omega_{LO}} \pi.$$

From Equation (1) and using the harmonic balance method, the down-converted signal can then be calculated and the conversion gain expressed as:

$$G_{cd} = 4g^2_1 Re\{Z_{IFLoad}\}/Re\{Y_{RFin}\} \tag{5}$$

where, $g_1 \approx a_2 E_0$.

The self-oscillating mixers of the present invention thus achieve oscillation, frequency and phase-locking to a reference signal, and mixing with a data signal, all in a low power consuming circuit. Thus, the circuits described herein will find many uses. One such use is in optical control of distributed electronics, for example, phased array antennas which require specialized circuits that are compatible with T/R level data mixing architecture. Furthermore, since circuits described herein combine non-linear mixing functions with relatively linear oscillating functions, other non-linear functions such as signal multiplying can be integrated with the mixing operation to achieve sophisticated circuit functions for many operations.

Figure 3:
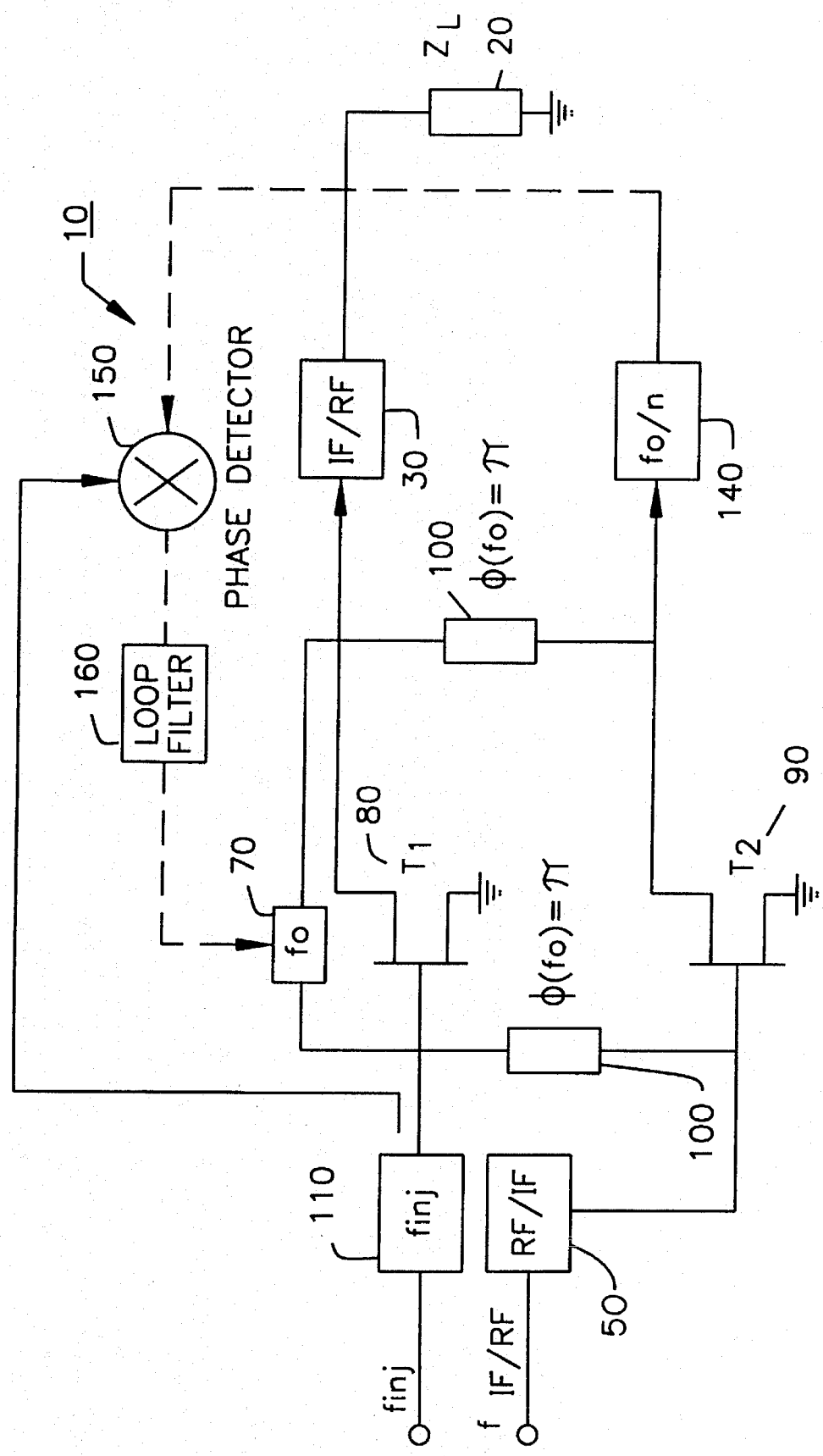
FIG. 3 is a schematic of a third embodiment of a self-oscillating mixer of the present invention which was fabricated by the inventors to determine the efficacy of the invention and which can be used as a building block to drive a phased array antenna at microwave or millimeter wave frequencies.

A preferred embodiment of a self-oscillating mixing circuit for such an application is shown at FIG. 3. In this case, the load 20 is, for example, a MMIC T/R which utilizes in the transmitter-receive mode the output signal having the second frequency as described above. Block 140 is interfaced with the drain of transistor 90 and acts to extract a signal fe/n, which is a subharmonic of the LO frequency fo. The signal, $f_o/n$, is output to a phase detector 150 that provides a phase lock loop for the circuit.

To avoid using a frequency multiplier or divider for phase locking, it is desired to directly extract the signal at the subharmonic frequency by taking advantage of the mixer's conversion gain. The concept of this subharmonic phase locking is depicted in FIG. 3. In this Figure, there are two major contributions to the signal at the reference frequency at block 140: (i) the amplified injection signal, $P_{amp}$; (ii) the mixed signal at $f_{LO}-(n-1)f_{inj}$, $P_{mix}$. When the oscillator is injection locked, the two signals combine into one which still carries phase information of the oscillation signal. Because of the high mixing gain, the oscillation phase information can be detected effectively at the phase detector.

Based on this phase lock loop, the phase control function can be easily achieved by comparing a DC reference voltage to the detected phase of the oscillation signal at the active loop filter. Since the phase shifting is caused by frequency detuning of the injection locked oscillator over the locking range, the phase shift is limited to −90° and +90°. Furthermore, the phase shift introduced to the oscillation signal could be transferred to the phase shift of the converted IF or RF signal. This phase shifting function performed in the same self-oscillating mixer circuit has applications in transmit/receive modules of phased array antennas, and in other frequency converter applications that require phase-shifted or phase-modulated output signals.

Even more preferably, loop filter 160 filters the phase lock loop signal output from phase detector 150 so that a phase comparison with $f_0$ and its subharmonics, $f_0/n$, can be accomplished. In this fashion, phase synchronization to the reference signal, $f_{inj}$, is provided by the phase lock loop. In still a further preferred embodiment, a Varactor/Schottky diode is incorporated in the feedback circuitry to tune the LO signal so as to reduce the phase difference between the synchronization signal, $f_{inj}$, and the output signal.

The circuit of FIG. 3 was actually fabricated by the inventors to compare measured parameters against predicted parameters for self-oscillating mixers in accordance with the present invention. The FETs were NEC Model NE720 FETs and were used to measure the non-linear I–V coefficients, that is, the "a"'s in Equation (1). A non-linear equivalent circuit model for the FETs was separately derived by fitting predicted S parameters to measured S parameters over a wide range of bias points.

The push-pull, self-oscillating mixer was simulated using a non-linear, computer-aided design simulation having optimization criteria such that the frequency of the LO was set at 12 GHz. Characterization of the circuit in this manner demonstrated an LO of 11.75 gigahertz and an output power as high as +10 dBm for operation in class A.

Figure 4:
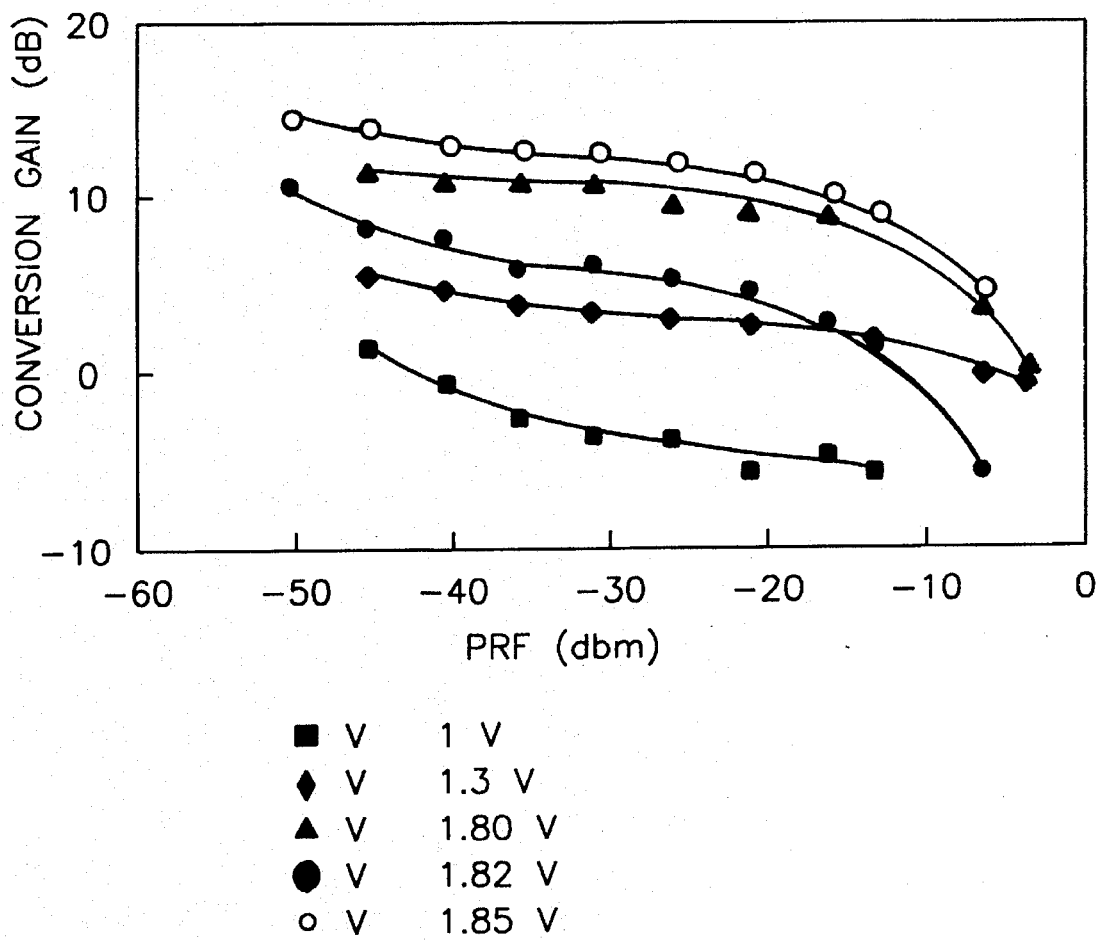
FIG. 4 is a graph of the measured conversion gain against the RF input power at different bias points for the circuit of FIG. 3.

The mixing performance of the self-oscillating design was also measured and a conversion gain of as high as 13 dB was achieved for a gate-to-source voltage, $V_{gs}$, =−1.82 volts. This corresponds to an LO output of about +2 dBm. Furthermore, a flat conversion gain of up to −10 dBm power level was achieved. The measured conversion gain against the RF input power at different bias points is shown in FIG. 4.

Figure 5:
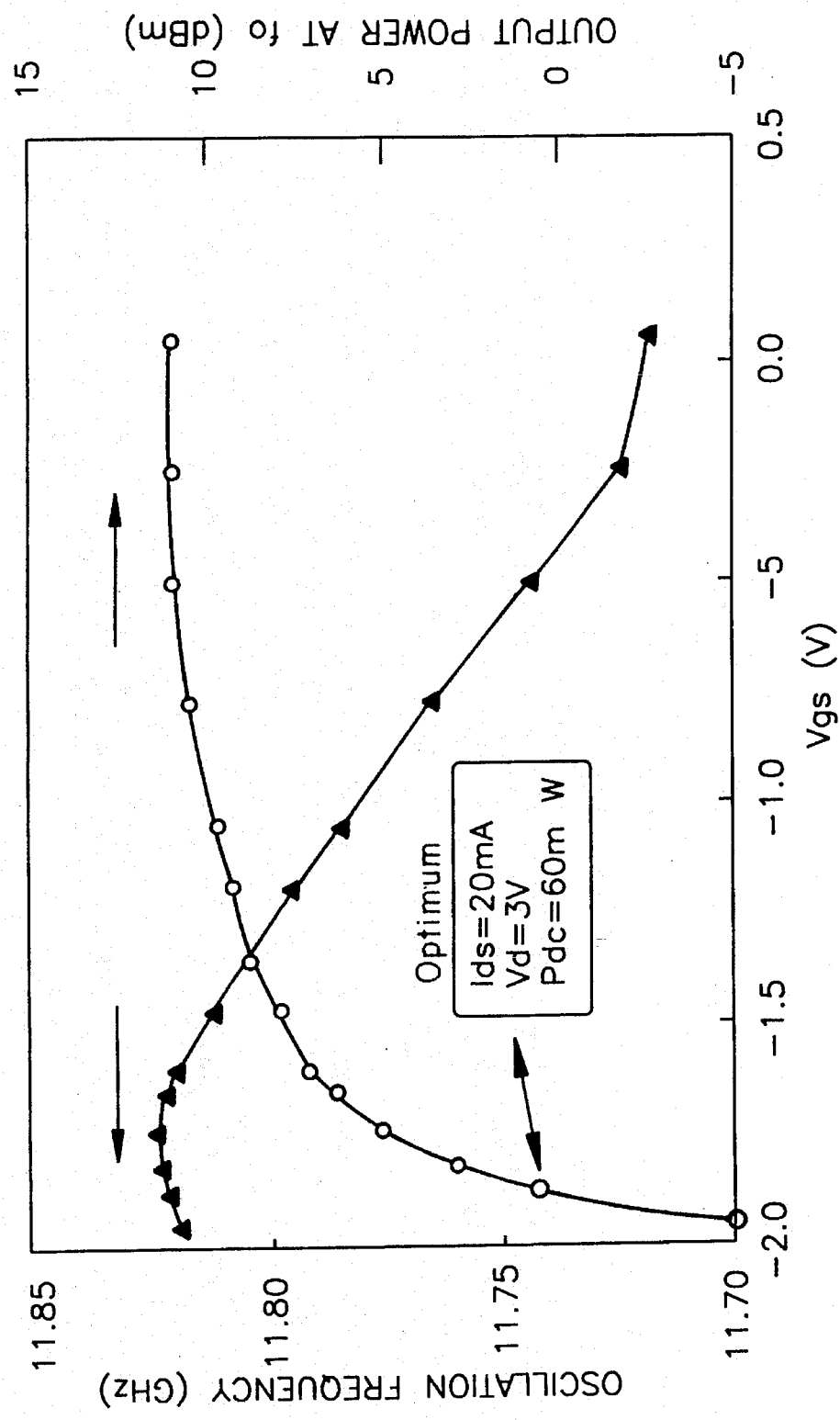
FIG. 5 is a graph of the LO characteristics and oscillator power consumption for the circuit of FIG. 3.
Figure 6:
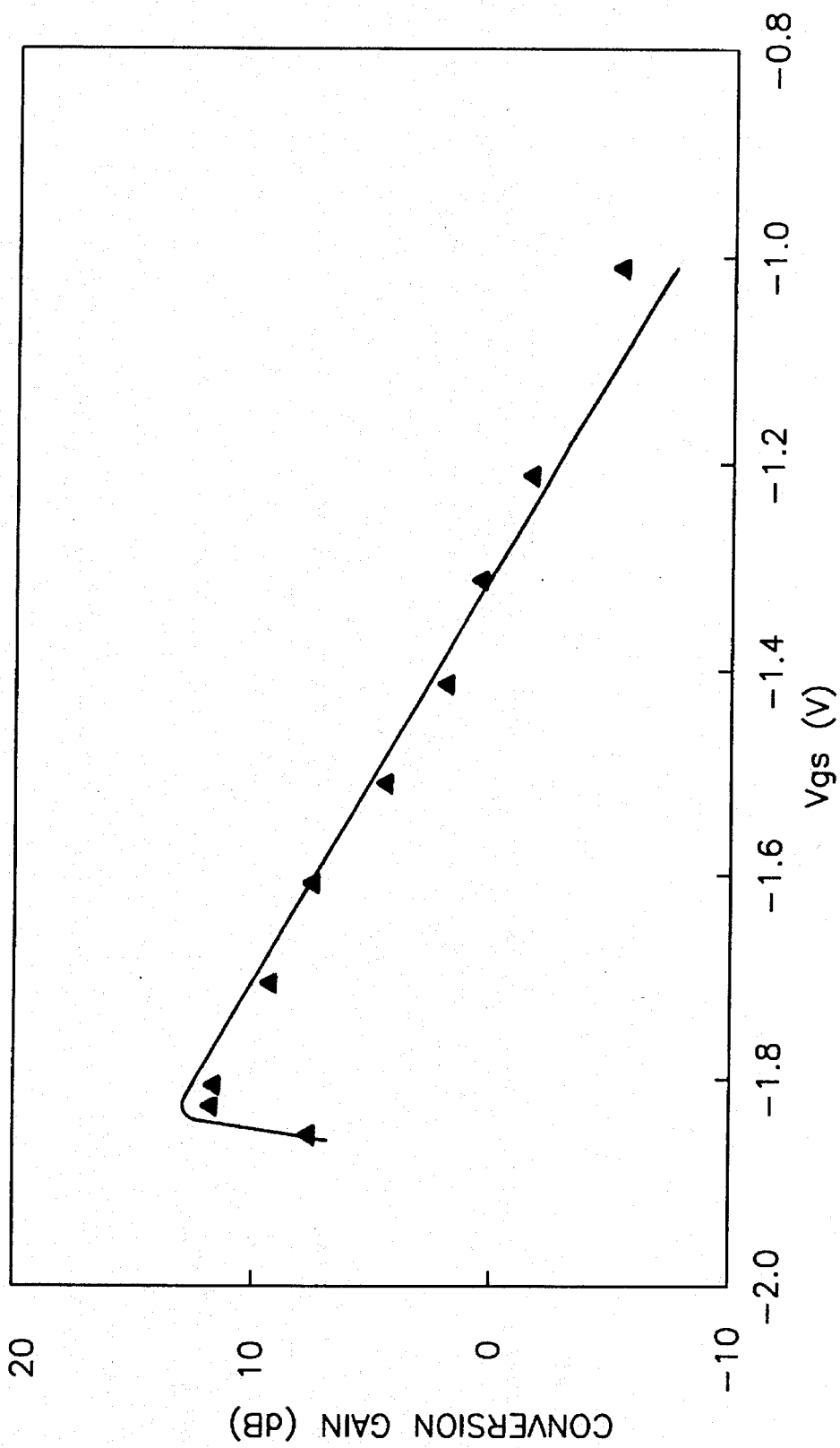
FIG. 6 is a graph of the conversion gain against the gate-to-source voltage for the transistors in the circuit of FIG. 3.

Several additional tests were run by the inventors to validate the feasibility of the self-oscillating mixer design of the present invention. Referring now to FIG. 5, the LO characteristics (in GHz) and system power consumption were plotted as a function of the of $V_{gs}$. A stable oscillating frequency occurs at −1.82 volts and as higher voltages are impressed on the system, (that is, the oscillator moves into the Class A category) the oscillation becomes more and more sensitive to bias voltage and therefore less stable. Concomitantly, as shown in FIG. 6, conversion gain plotted against $V_{gs}$ shows that mixer conversion gain is also optimum near or about −1.82 volts.

Figure 7:
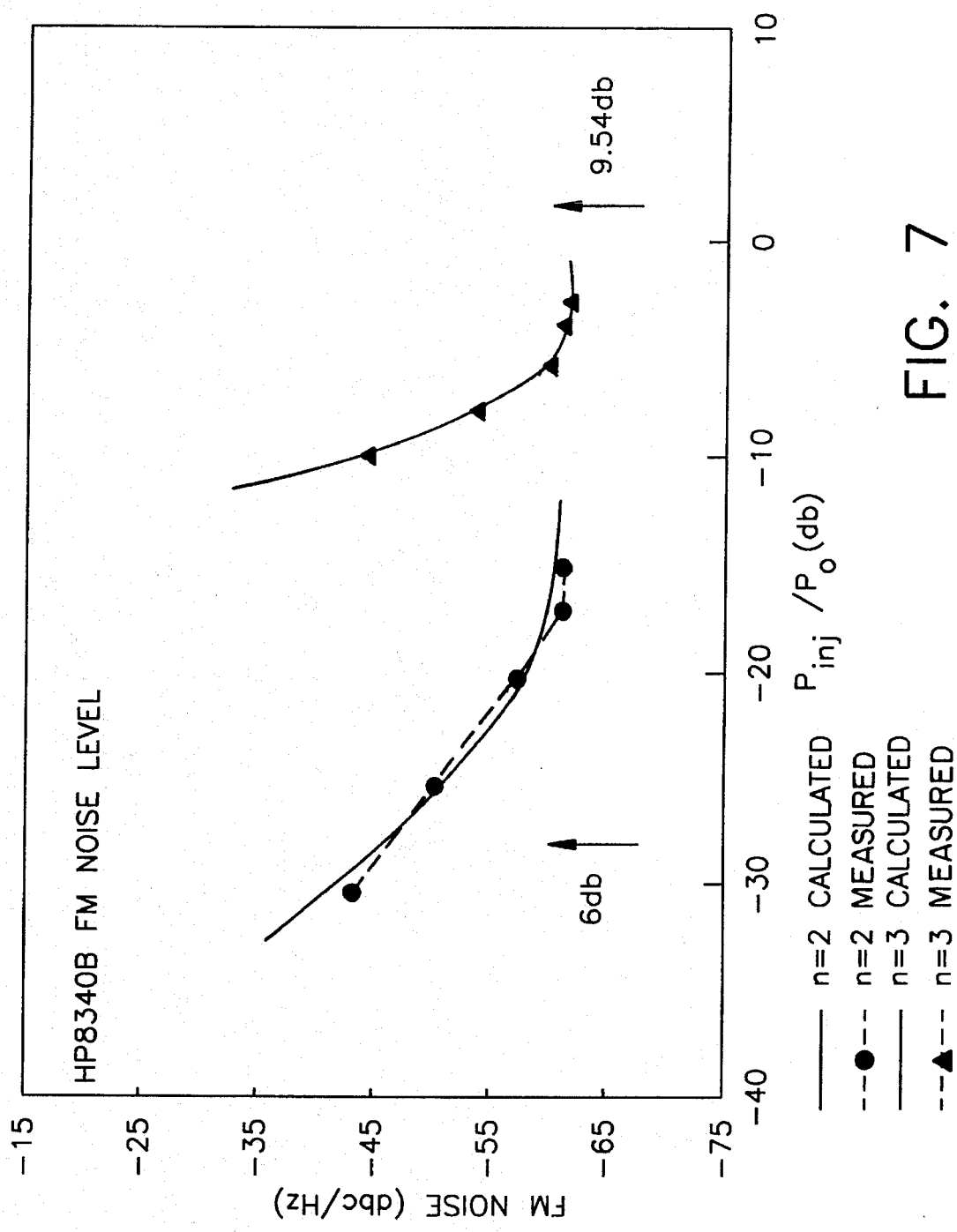
FIG. 7 is a graph of the FM noise against the ratio of the injected power to the output power at a 100 Hz offset carrier frequency for the circuit of FIG. 3.
Figure 8:
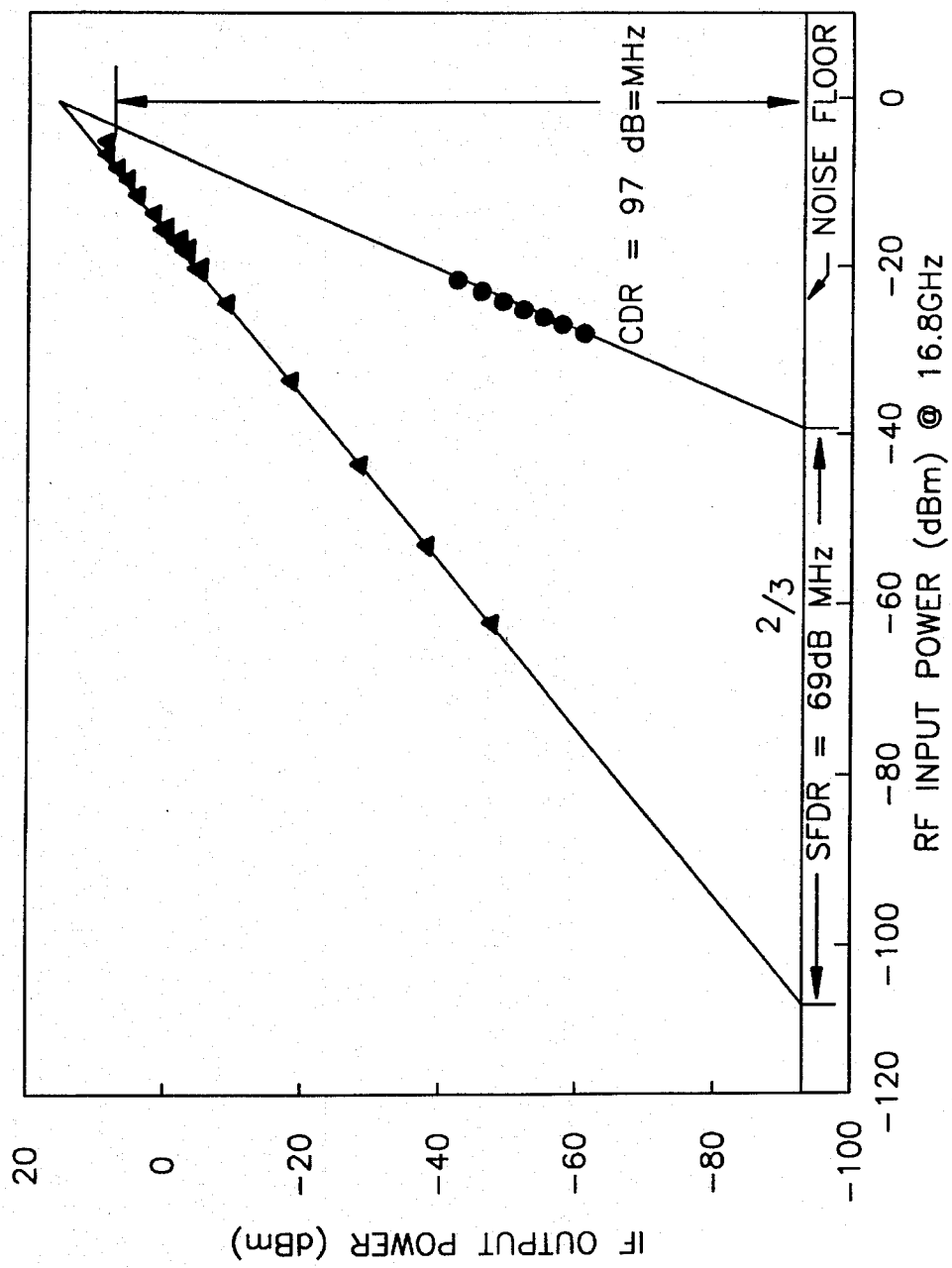
FIG. 8 is a graph of the IF output power against the RF input power to illustrate the dynamic ranges of the circuit of FIG. 3.

In FIG. 7, FM noise is plotted against the ratio of the injected power, $P_{inj}$, to the LO power, $P_0$, at a 100 Hz offset carrier frequency. This figure shows that when the locking range is large, FM noise levels under second and third subharmonic injection locking are exactly above 6 dB and 9.45 dB of the injected second and third subharmonic's FM noise levels, respectively. FIG. 7 indicates that optimum mixing and oscillation is achieved without sacrificing noise performance since the power gain is well above the FM noise levels. Furthermore, as shown in FIG. 8, the dynamic range of the circuit stands well above the noise floor and thus dynamic ranges of greater than 69 dB.MHz$^{2/3}$ (spurious free dynamic range) and 97 dB.MHz (compression dynamic range) are achieved.

Figure 9:
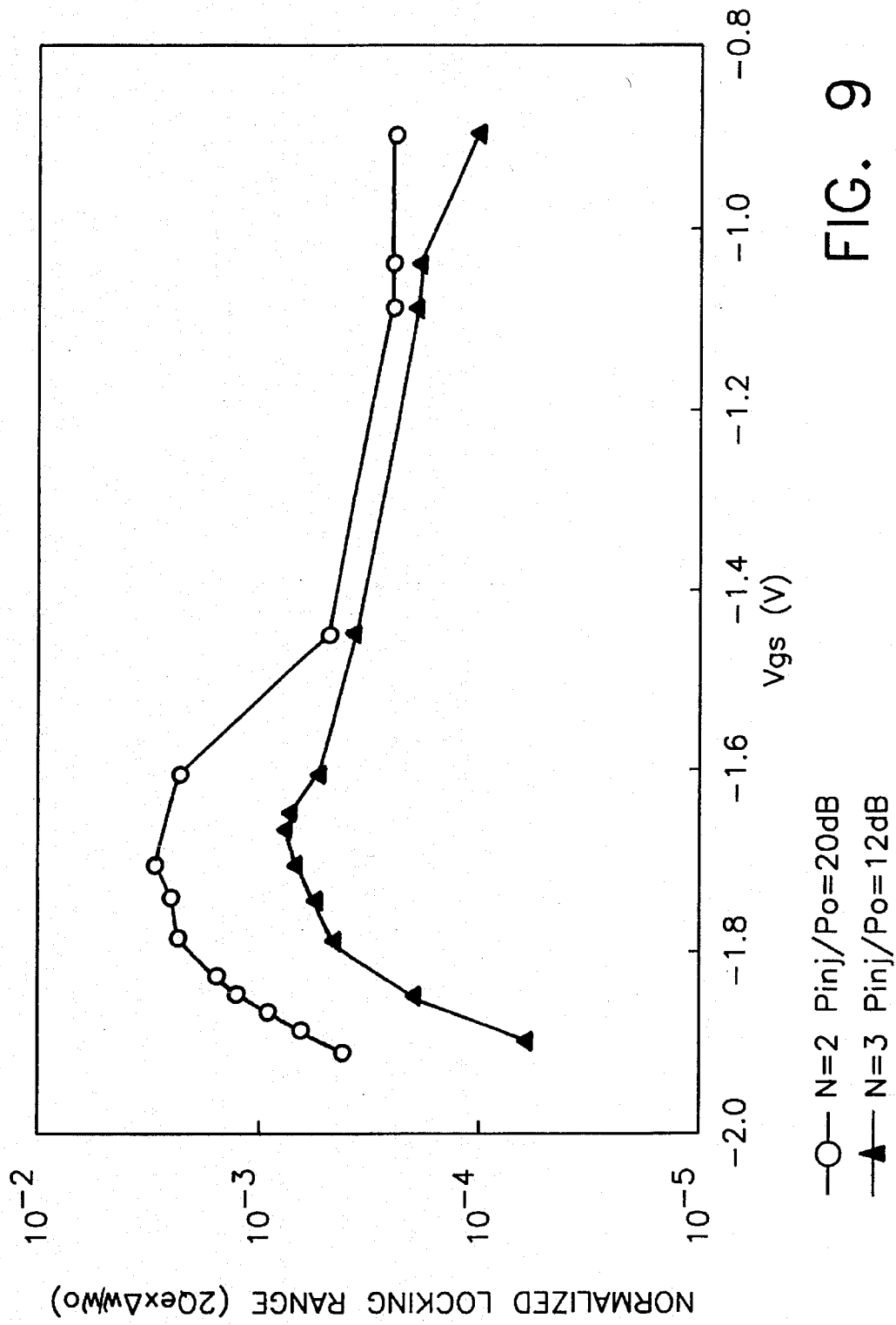
FIG. 9 is a graph of the normalized locking range against the gate-to-source voltage for the circuit of FIG. 3.

Finally, FIG. 9 illustrates that the injection locking range is also large at the optimum bias voltage of about −1.82 $V_{gs}$. Thus, for example, in designs which will utilize a crystal oscillator equivalent results can be achieved with the salutary effect of further decreasing the overall system power consumption.

As discussed above, self-oscillating mixers provided in accordance with the present invention are particularly useful for optically controlled phased array antennas. Phased array antennas are typically used in satellite communications, mobile communications systems, radar and remote sensing systems which usually operate at microwave to millimeter wavelengths. In these applications, fiber optic links provide frequency reference signals to synchronize distributed local oscillators and data signals to or from T/R modules.

Figure 10A:
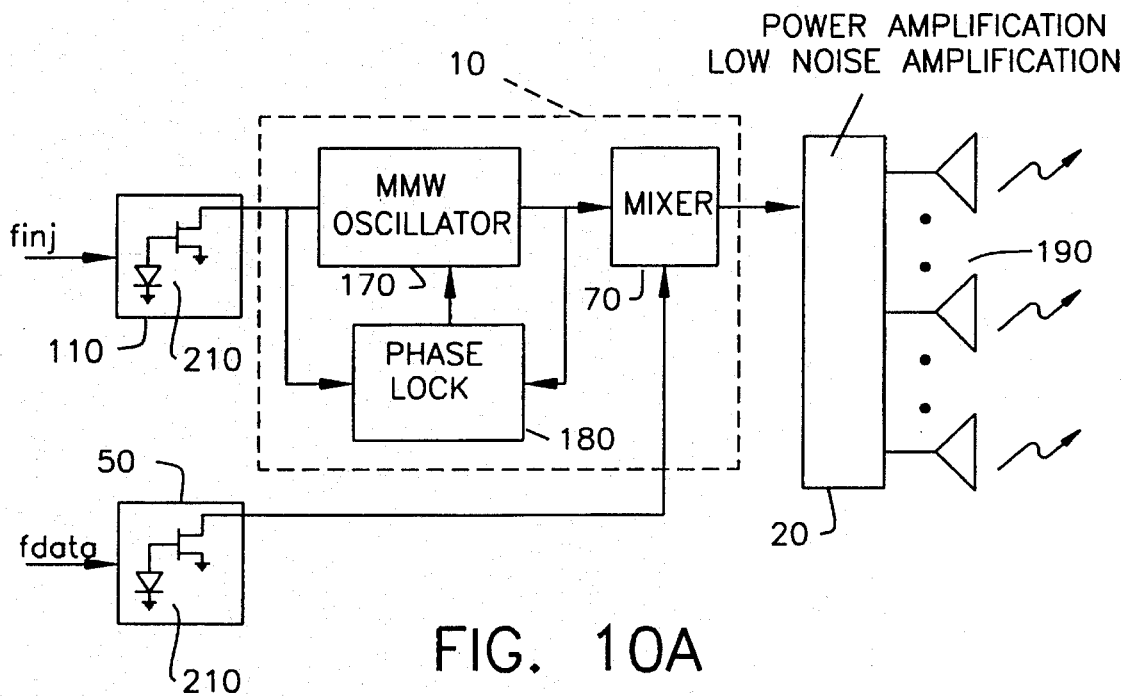
Figure 10B:
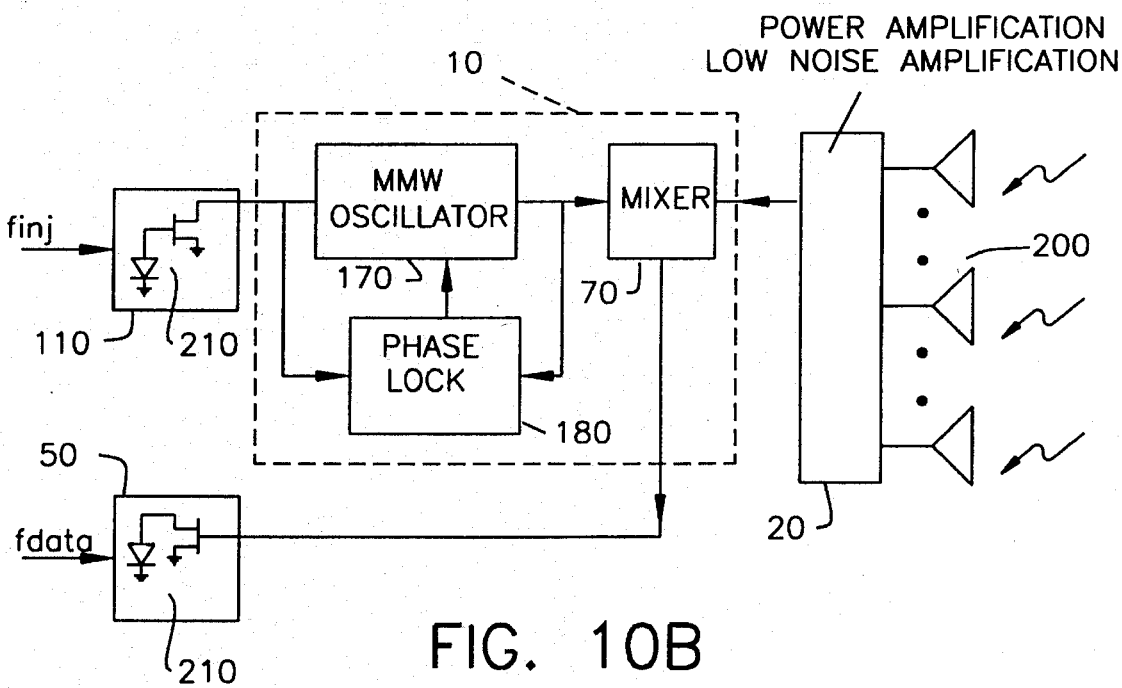

A preferred embodiment of an optically controlled phased array antenna system utilizing a self-oscillating mixer provided in accordance with the present invention is shown in FIGS. 10A (transmit mode) and 10B (receive mode). The circuit 10 preferably comprises a millimeter wave (MMW) oscillator 170 which further comprises the push-pull transistors 80 and 90 and transmission lines 100 to provide oscillation. The phase lock block 180 preferably comprises phase detector 150, loop filter 160, and frequency division block 140 as referenced with respect to FIG. 3 above. The mixer 70 receives the LO signal from MMW block 170 which has been locked to the input frequency via the injection block 110. The mixed oscillating signal is output to the MMIC T/R load 20, which then transmits a signal, shown at 190. Similarly in FIG. 10B, a signal shown at 200 is received by the MMIC T/R and input to the system to be output as a data signal by data block 50.

The injection block 110 and input data block 50 preferably included photodiodes 210. In a further preferred embodiment, $f_{inj}$ and $f_{data}$ are received from an optical distribution network which may comprise central processing units and other control circuitry that produce phased array antenna data signals, or that process incoming signals such as those shown generally at 200 in FIG. 10B.

Thus, in the transmit mode shown in FIG. 10A, the output of the mixer 70 is a modulated carrier. Similarly, in the receive mode of operation shown in FIG. 10B, the output of the mixer is the data signal 50. Circuits provided in accordance with the present invention provide an efficient integrated interface between the MMIC T/R load 20 and the blocks 110 and 150. The circuit achieves stabilized oscillation, low FM noise degradation, large subharmonic injection locking range and high frequency conversion gain because of high non-linearity in the selected operation range. These circuits also provide high efficiency and high quality performance self-oscillations, while maintaining low FM noise degradation, large locking range, and large subharmonic factors. Additionally, phase locking of the injection locked oscillator provided in accordance with the present invention stabilizes the phase of the injection locked oscillator to the frequency references provided. Furthermore, mixing of the IF/RF data signals with the stabilized local oscillator provides high conversion efficiency and a low noise figure.

The circuits provided in accordance with the present invention therefore provide a unique and specialized subsystem circuit topology for many applications. The most specific application is a T/R compatible MMIC design which will realize efficient large phased array antennas at millimeter wavelengths. In addition to the phased array antenna, optical coupling application described above, the circuits described herein will find use in, among others, the mobile telephone and wireless telephone markets, fiber optic network market, television and radio markets, personal communication network market, global positioning systems market, low earth orbit satellite market, video satellite market, and wireless in-building system market. The versatility and wide-ranging applicability of circuits provided in accordance with the present invention solve a long-felt need in the art for self-oscillating mixers which have applicability in nearly any communications subsystem.

Furthermore, the circuits claimed and described herein employ a minimum number of devices to achieve both self-oscillation and local oscillator mixing capabilities. These circuits occupy small spaces, weigh little, and consume minimal amounts of power. Because the circuits operate close to the Class B range, the non-linearity of the transistor devices in the self oscillating mixers can be enhanced. Large non-linearity increases the subharmonic injection locking range of the oscillator and therefore minimizes the phase noise degradation while enhancing the conversion gain of the mixer. Such results have not heretofore been achieved in the art.

There have thus been described certain preferred embodiments of self-oscillating mixers provided in accordance with the present invention. While preferred embodiments have been described and disclosed, it will be recognized by those with skill in the art that modifications are within the true spirit and scope of the invention. The appended claims are intended to cover all such modifications.

What is claimed is:

1. A tunable communications circuit for transforming a signal having a first frequency to a signal having a second frequency comprising:

push-pull amplifier means for amplifying the signal having the first frequency to produce an amplified signal, wherein the push-pull amplifier means comprises a pair of field effect transistors;

feedback means coupled to the push-pull amplifier means for phase shifting the amplified signal during each half cycle of the push-pull amplifier means, thereby creating an oscillating output signal, wherein the feedback means comprises at least one transmission line connected between a drain and a gate of one of the field effect transistors such that a substantially one hundred and eighty degree phase shift is introduced to the amplified signal;

means coupled to said push-pull amplifier means for coupling said oscillating output signal to said signal having the first frequency, whereby said push-pull amplifier means mixes the signal having the first frequency with the oscillating signal to produce the signal of the second frequency;

means interfaced with a gate terminal of one of the pair of field effect transistors for locking the frequency of the oscillating signal to prevent the oscillating signal from being free-running;

output means coupled to drain terminals of the pair of field effect transistors for receiving the signal having the second frequency; and wherein the transistors operate at Class B for both oscillation and mixing functions and said Class B operation enables simultaneous realization of large locking range and high conversion gain; and wherein the circuit exhibits phase control of said signals of said first and second frequency.

2. The communications circuit recited in claim 1, wherein said means for locking the frequency of the oscillating signal includes means for introducing an injection signal for synchronization with said oscillating signal.

3. The communications circuit recited in claim 2, wherein said signal having said first frequency and said injection signal are received from an optical distribution network.

4. The communications circuit recited in claim 1, wherein said circuit is operable as part of an optically controlled phased array antenna system.

5. The communications circuit recited in claim 1, wherein said push-pull amplifier means and said at least one transmission line are integrally formed as part of millimeter wave oscillator (MMW).

6. A self-oscillating mixer circuit for converting a signal having a first frequency to a signal having a second frequency comprising:

first amplifier means for receiving the signal of the first frequency and amplifying the signal of the first frequency during a half cycle of the signal of the first frequency, wherein said first amplifier means comprises a first field effect transistor;

second amplifier means coupled to the first amplifier means for amplifying the signal of the first frequency during an alternate half cycle of the signal of the first frequency, wherein said second amplifier means comprises a second field effect transistor, and wherein said first and second amplifier means are interfaced together to form a push-pull amplifier;

phase shift means coupled to said first and second field effect transistors for shifting an amplified signal output from said first and second amplifier means to cause the amplified signal output to oscillate, thereby producing an oscillating signal, wherein the phase shift means comprises at least one transmission line connected in a feedback loop between a drain and a gate of one of the field effect transistors such that a substantially one hundred and eighty degree phase shift is introduced to the amplified signal;

means coupled to said phase shift means for mixing said oscillating signal with said signal of the first frequency, thereby producing the signal having the second frequency;

means interfaced with a gate terminal of one of the pair of field effect transistors for locking the frequency of the oscillating signal to prevent the oscillating signal from being free-running;

output means coupled to drain terminals of the pair of field effect transistors for receiving the signal having the second frequency; and division means coupled to a drain terminal of one of the field the field effect transistors for dividing the oscillating signal into signals corresponding to subharmonic signals of the oscillating signal.

7. The self-oscillating mixer circuit recited in claim 6 further comprising phase detection means interfaced with the division means for detecting the subharmonic signals to provide a phase lock loop to the self-oscillating mixer circuit.

* * * * *